US012696769B2

(12) United States Patent
Kim

(10) Patent No.: US 12,696,769 B2
(45) Date of Patent: Jul. 28, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Hyun Su Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 18/144,350

(22) Filed: May 8, 2023

(65) Prior Publication Data

US 2024/0014144 A1    Jan. 11, 2024

(30) Foreign Application Priority Data

Jul. 7, 2022    (KR) ........................ 10-2022-0083571

(51) Int. Cl.
*H10W 46/00* (2026.01)
*H10B 80/00* (2026.01)
(Continued)

(52) U.S. Cl.
CPC ............ *H10W 46/00* (2026.01); *H10B 80/00* (2023.02); *H10W 74/016* (2026.01);
(Continued)

(58) Field of Classification Search
CPC . H01L 23/544; H01L 23/293; H01L 23/3107; H01L 21/565; H01L 24/16; H01L 24/32; H01L 24/48; H01L 24/73; H01L 25/0657; H01L 2224/16227; H01L 2224/32145;

H01L 2224/32225; H01L 2224/48228; H01L 2224/73204; H01L 2224/73253; H01L 2224/73265; H01L 2225/06517; H01L 2225/06593;
(Continued)

(56) References Cited

U.S. PATENT DOCUMENTS 7,883,985 B2    2/2011  Matsui
9,824,925 B2    11/2017  Farooq et al.
(Continued)

FOREIGN PATENT DOCUMENTS

JP    2003-007766 A    1/2003
JP    2003-234451 A    8/2003
(Continued)

OTHER PUBLICATIONS

1st Office Action issued Nov. 13, 2025 in corresponding Korean Patent Application No. 10-2022-0083571.

*Primary Examiner* — Timor Karimy
(74) *Attorney, Agent, or Firm* — MORGAN, LEWIS & BOCKIUS LLP

(57) ABSTRACT

A semiconductor package includes: a substrate; a first semiconductor chip disposed on the substrate, wherein the first semiconductor chip includes first and second surfaces, which are opposite to each other, and has first and second trenches formed on the first surface thereof, wherein the first and second trenches extend in first and second directions, respectively, wherein the first and second direction intersect each other; and a second semiconductor chip disposed on the first semiconductor chip and in a region between the first and second trenches.

14 Claims, 14 Drawing Sheets

(51) Int. Cl.

| | |
|---|---|
| *H10W 74/01* | (2026.01) |
| *H10W 74/10* | (2026.01) |
| *H10W 74/15* | (2026.01) |
| *H10W 74/47* | (2026.01) |
| *H10W 90/00* | (2026.01) |
| *H10W 72/00* | (2026.01) |

(52) U.S. Cl.

CPC .......... *H10W 74/111* (2026.01); *H10W 74/47* (2026.01); *H10W 90/00* (2026.01); *H10W 72/877* (2026.01); *H10W 72/884* (2026.01); *H10W 74/15* (2026.01); *H10W 90/724* (2026.01); *H10W 90/732* (2026.01); *H10W 90/734* (2026.01); *H10W 90/754* (2026.01)

(58) Field of Classification Search

CPC ..... H01L 2924/1436; H01L 2924/1437; H01L 2924/1441; H10B 80/00; H10W 46/00; H10W 90/00; H10W 90/732; H10W 90/724; H10W 90/754; H10W 90/734; H10W 74/47; H10W 74/111; H10W 74/016; H10W 74/15; H10W 72/877; H10W 72/884

See application file for complete search history.

(56) References Cited

U.S. PATENT DOCUMENTS

| | | | |
|---|---|---|---|
| 10,163,807 B2 | 12/2018 | Chen et al. | |
| 10,727,126 B2 | 7/2020 | Kaspar et al. | |
| 2017/0084545 A1 | 3/2017 | Seddon et al. | |
| 2019/0214423 A1* | 7/2019 | Kim ....................... | H01L 24/16 |
| 2021/0366771 A1 | 11/2021 | Sreenivasan et al. | |

FOREIGN PATENT DOCUMENTS

| | | | |
|---|---|---|---|
| JP | 2021-192442 | A | 12/2021 |
| KR | 10-2004-0069893 | | 8/2004 |
| KR | 10-2017-0140985 | A | 12/2017 |

* cited by examiner

III-III'

SEMICONDUCTOR PACKAGE AND METHOD OF FABRICATING THE SAME

CROSS-REFERENCE TO RELATED APPLICATION

This application claims priority under 35 U.S.C. 119(a) to Korean Patent Application No. 10-2022-0083571 filed on Jul. 7, 2022 in the Korean Intellectual Property Office, the disclosure of which is incorporated by reference herein in its entirety.

TECHNICAL FIELD

The present inventive concept relates to a semiconductor package and a method of manufacturing the same

DISCUSSION OF THE RELATED ART

For high-integration and high-performance operations of a semiconductor device, a method of stacking semiconductor chips has been under development. For example, a multi-chip package, in which a plurality of chips are mounted in one semiconductor package, a system-in package, in which stacked heterogeneous chips operate as a single system, and the like have been under development.

To electrically connect stacked semiconductor chips to a substrate or other semiconductor chips, a wire bonding method or a flip chip bonding method may be used. The flip chip bonding method refers to a packaging method of electrically connecting a die and electrode terminals to each other, and the wire bonding method refers to a packaging method using wires.

However, in a case where semiconductor chips are stacked using the flip chip bonding method or the wire bonding method, defects may occur due to misalignment between the stacked semiconductor chips.

SUMMARY

Aspects of the present inventive concept provide a semiconductor package capable of increasing product reliability by preventing the misalignment between semiconductor chips.

Aspects of the present inventive concept also provide a method of fabricating a semiconductor package capable of increasing product reliability by preventing misalignment between semiconductor chips.

However, aspects of the present inventive concept are not restricted to those set forth herein. The above and other aspects of the present inventive concept will become more apparent to one of ordinary skill in the art to which the present inventive concept pertains by referencing the detailed description of the present disclosure given below.

According to an exemplary embodiment of the present inventive concept, a semiconductor package includes: a substrate; a first semiconductor chip disposed on the substrate, wherein the first semiconductor chip includes first and second surfaces, which are opposite to each other, and has first and second trenches formed on the first surface thereof, wherein the first and second trenches extend in first and second directions, respectively, wherein the first and second direction intersect each other; and a second semiconductor chip disposed on the first semiconductor chip and in a region between the first and second trenches.

According to an exemplary embodiment of the present inventive concept, a semiconductor package includes: a substrate; a first semiconductor chip disposed on the substrate, wherein the first semiconductor chip has first and second trenches formed thereon along first and second directions, which intersect each other; and a second semiconductor chip disposed on the first semiconductor chip, wherein each of the first and second trenches includes sidewalls extending in a third direction, which intersects the first and second directions, and a bottom surface connecting to the sidewalls, and the sidewalls of the first trench are aligned with the second semiconductor chip in the third direction.

According to an exemplary embodiment of the present inventive concept, a method of fabricating a semiconductor package includes: providing a substrate; providing a first semiconductor chip on the substrate, wherein the first semiconductor chip has first and second trenches formed thereon along first and second directions, which intersect each other; providing a second semiconductor chip on the first semiconductor chip; and aligning sidewalls of each of the first trenches with the second semiconductor chip, wherein the second semiconductor chip is disposed in a region between the first and second trenches.

BRIEF DESCRIPTION OF THE DRAWINGS

The above and features of the present inventive concept will become more apparent by describing in detail exemplary embodiments thereof with reference to the attached drawings, in which:

FIG. 3 is an enlarged cross-sectional view of an area R of FIG. 1;

FIG. 4 is a cross-sectional view taken along line II-II' of FIG. 1;

FIGS. 9 and 10 are layout views of semiconductor packages according to an exemplary embodiment of the present inventive concept; and FIGS. 11, 12, 13 and 14 illustrate a method of fabricating a semiconductor package according to an exemplary embodiment of the present inventive concept.

DETAILED DESCRIPTION OF THE EMBODIMENTS

Figure 1:
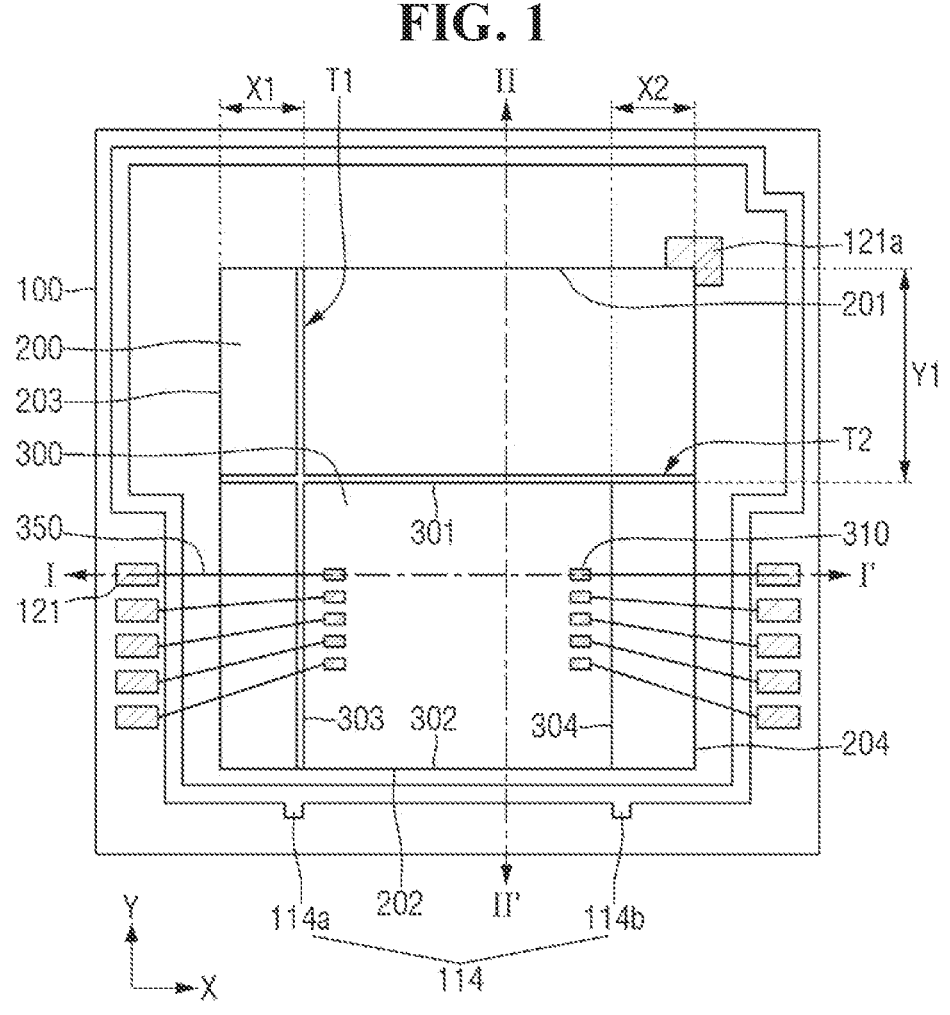
FIG. 1 is a layout view of a semiconductor package according to an exemplary embodiment of the present inventive concept.

Embodiments of the present inventive concept will hereinafter be described with reference to the accompanying drawings. Like reference numerals indicate like elements throughout the present disclosure, and thus, repetitive descriptions thereof will be omitted.

Figure 2:
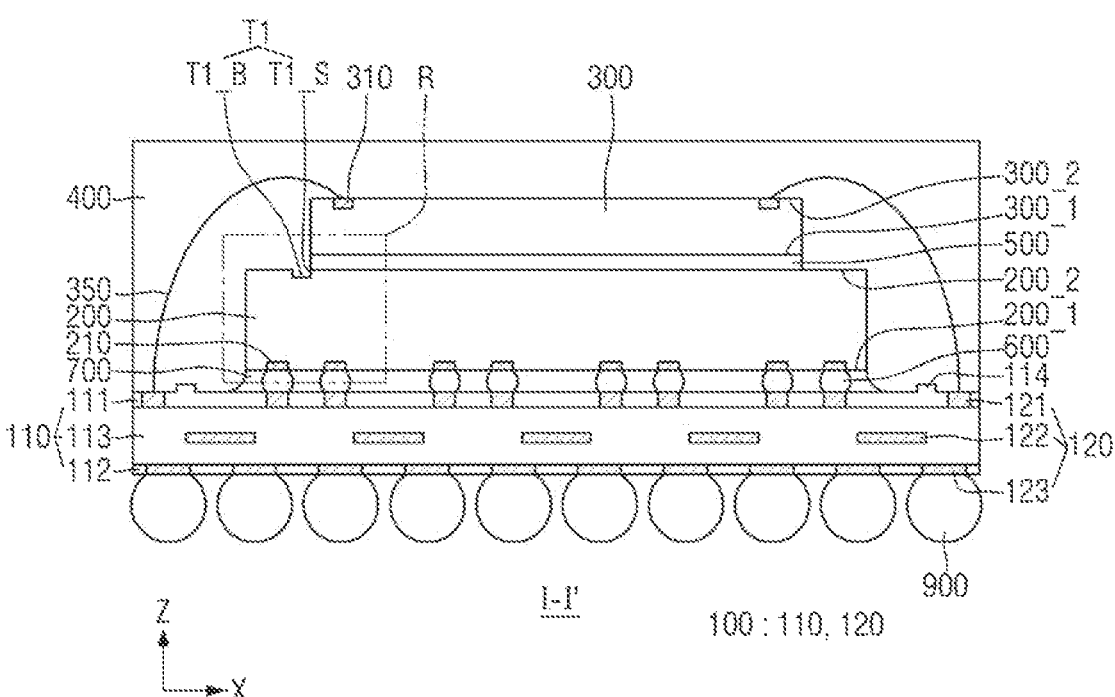
FIG. 2 is a cross-sectional view taken along line I-I' of FIG. 1.
Figure 3:
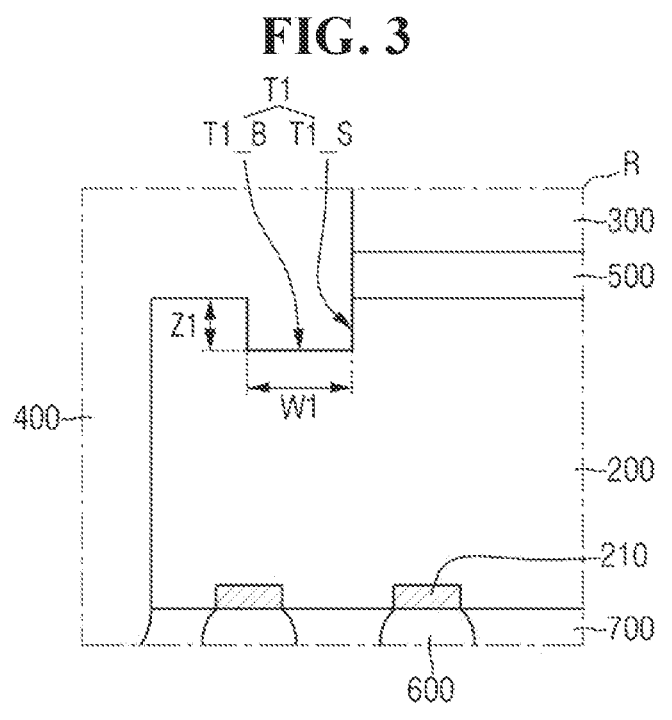
Figure 4:
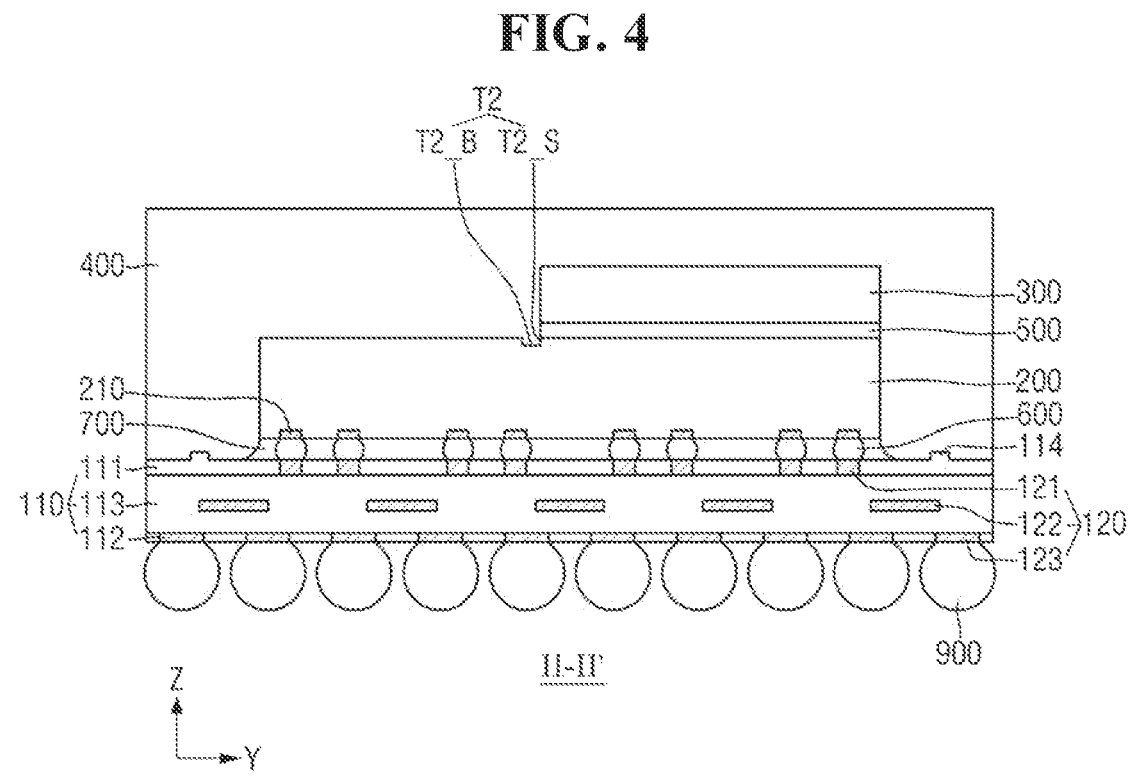

FIG. 1 is a layout view of a semiconductor package according to an exemplary embodiment of the present inventive concept. FIG. 2 is a cross-sectional view taken along line I-I' of FIG. 1. FIG. 3 is an enlarged cross-sectional view of an area R of FIG. 1. FIG. 4 is a cross-sectional view taken along line II-II' of FIG. 1.

Referring to FIG. 1, the semiconductor package according to an exemplary embodiment of the present inventive concept may include a substrate 100, a first semiconductor chip 200, and a second semiconductor chip 300 and may further include a mold layer 400.

The substrate 100 may include an insulating layer 110, which includes a first passivation film 111, a second passivation film 112, and an insulating film 113, and a wiring layer 120, which includes a plurality of wirings 121, 122, and 123.

A surface (e.g., the top surface) of the substrate 100 may extend in first and second directions Y and X, which intersect each other. The first and second semiconductor chips 200 and 300 may be stacked on the top surface of the substrate 100.

A plurality of external connecting terminals 900 may be disposed on the other surface (e.g., the bottom surface) of the substrate 100. The substrate 100 may include the wirings 121, 122, and 123, which are for electrically connecting the first and second semiconductor chips 200 and 300 to the external connecting terminals 900.

The external connecting terminals 900 may have, for example, a spherical or elliptic-spherical shape, but the present inventive concept is not limited thereto. The external connecting terminals 900 may include at least one of, for example, tin (Sn), indium (In), lead (Pb), zinc (Zn), nickel (Ni), gold (Au), silver (Ag), copper (Cu), antimony (Sb), bismuth (Bi), and a combination thereof, but the present inventive concept is not limited thereto.

The external connecting terminals 900 may electrically connect the substrate 100 to external devices. Accordingly, the external connecting terminals 900 may provide electrical signals from external devices to the substrate 100 and may provide electrical signals from the substrate 100 to external devices.

The substrate 100 may include, for example, a printed circuit board (PCB) or a ceramic substrate, but the present inventive concept is not limited thereto.

In a case where the substrate 100 includes a PCB, the insulating film 113 may be formed of at least one of, for example, a phenolic resin, an epoxy resin, and/or polyimide. For example, the insulating film 113 may include at least one of an Ajinomoto build-up film (ABF), FR-4, tetrafunctional epoxy, polyphenylene ether, epoxy/polyphenylene oxide, bismaleimide triazine (BT), Thermount, cyanate ester, polyimide, and/or a liquid crystal polymer.

The first and second passivation films 111 and 112 may include, for example, a photo-imageable dielectric (PID) material, but the present inventive concept is not limited thereto.

One surface of the insulating film 113 may be covered by the first passivation film 111, and some of the wiring 121 might not be completely covered by the first passivation film 111, and may be exposed, instead. The exposed wiring 121 may function as pads and may be connected to pads 310 of the second semiconductor chip 300 through bonding wires 350.

The other surface of the insulating film 113 may be covered by the second passivation film 112, and some of the wiring 123 might not be completely covered by the second passivation film 112, and may be exposed, instead. The exposed wiring 123 may be connected to the external connecting terminals 900. For example, the exposed wiring 123 may be directly connected to the external connecting terminals 900.

The wiring 121 may include a first alignment pattern 121a, which is disposed to correspond to a corner area of the first semiconductor chip 200. The first alignment pattern 121a may be wiring 121 exposed by etching part of the first passivation film 111. The first alignment pattern 121a may be used to align the second semiconductor chip 300.

The wiring layer 120 may be formed as a multilayer. The wiring layer 120 may be formed as, for example, a triple layer, but the present inventive concept is not limited thereto. In addition, the wiring layer 120 may be formed as a double layer or as a quadruple layer.

The wiring layer 120 may further include a plurality of vias, which are for electrically connecting the wirings 121, 122, and 123 to one another.

The wiring layer 120 may include, for example, a conductive material. For example, the wiring layer 120 may include at least one of Cu, aluminum (Al), Ni, Ag, Au, platinum (Pt), Sn, Pb, titanium (Ti), chromium (Cr), palladium (Pd), In, Zn, and carbon (C) or an alloy of such metal.

The first semiconductor chip 200 is disposed on the first passivation film 111. The first semiconductor chip 200 may have first and second surfaces 200_1 and 200_2, which are opposite to each other. For example, the first semiconductor chip 200 may be mounted on the substrate 100 via flip chip bonding. The first surface 200_1 of the first semiconductor chip 200 may be an active surface that is electrically connected to the substrate 100.

The substrate 100 may further include a second alignment pattern 114, which protrudes in a third direction Z from the top surface of the first passivation film 111. The second alignment pattern 114 may include, for example, part of a solder resist layer of the substrate 100. Referring to FIG. 1, in a plan view, the second alignment pattern 114 may be disposed to at least partially surround the first semiconductor chip 200.

The second alignment pattern 114 may include first and second extensions 114a and 114b, which extend in the first direction Y and are spaced apart from each other in the second direction X, in a plan view. For example, the first and second extensions 114a and 114b may be formed to correspond to the corners of the second semiconductor chip 300.

The distance, in the second direction X, between the first and second extensions 114a and 114b may correspond to the length of a lateral side 302 of the second semiconductor chip 300. The first and second extensions 114a and 114b may prevent the misalignment of the second semiconductor chip 300, on the substrate 100 and the first semiconductor chip 200.

The first and second extensions 114a and 114b may extend in the second direction X and may be spaced apart from each other in the first direction Y, in a plan view.

In an exemplary embodiment of the present inventive concept, the location, the protruding length, and the number of second alignment patterns 114 are not particularly limited as long as the second semiconductor chip 300 can be precisely aligned. In addition to what is illustrated in FIG. 2, the second alignment pattern 114 may be recessed into the substrate 100 in the third direction Z. In this case, the second alignment pattern 114 may be recessed in the third direction Z from the top surface of the first passivation film 111.

Referring to FIGS. 1 and 2, first and second trenches T1 and T2, which extend in the first and second directions Y and X, respectively, may be formed on the second surface 200_2 of the first semiconductor chip 200. The second semiconductor chip 300 may be disposed in the region between the first and second trenches T1 and T2.

For example, the first semiconductor chip 200 may be a silicon (Si) chip, and the second semiconductor chip 300 may be a memory chip.

The second semiconductor chip 300 may be, for example, a volatile memory chip such as a dynamic random-access memory (DRAM) or a static random-access memory (SRAM), a nonvolatile memory chip such as a phase-change random-access memory (PRAM), a magneto-resistive random-access memory (MRAM), a ferroelectric random-access memory (FeRAM), or a resistive random-access memory (RRAM), or a high-bandwidth memory (HBM) chip in which multiple DRAM chips are stacked, the present inventive concept is not limited thereto.

Referring to FIGS. 1 and 2, the first semiconductor chip 200 may have first and second lateral sides 201 and 202, which are opposite to each other in the first direction Y, and third and fourth lateral sides 203 and 204, which are opposite to each other in the second direction X and are connected to the first and second lateral sides 201 and 202. The first through fourth lateral sides 201 through 204 may connect the first and second surfaces 200_1 and 200_2, which are opposite to each other, to each other.

Referring to FIG. 3, the first trench T1 may have sidewalls T1_S extending in the third direction Z, which intersects the first and second directions Y and X, and a bottom surface T1_b connecting the sidewalls T1_S to each other. The sidewalls T1_S of the first trench T1 may be aligned with the second semiconductor chip 300 in the third direction Z. For example, a sidewall T1_S may be coplanar with a side surface of the second semiconductor chip 300.

For example, a length W1, in the second direction X, of the bottom surface T1_B of the first trench T1, i.e., the width of the first trench T1, may be greater than a length Z1, in the third direction Z, of the sidewalls T1_S of the first trench T1, but the present inventive concept is not limited thereto.

Referring to FIG. 4, the second trench T2 may have sidewalls T2_S extending in the third direction Z, and a bottom surface T2_b connecting the sidewalls T2_S to each other. The sidewalls T2_S of the second trench T2 may be aligned with the second semiconductor chip 300 in the third direction Z. For example, a sidewall T2_S of the second trench T2 may be coplanar with a side surface of the second semiconductor chip 300.

The length, in the first direction Y, of the bottom surface T2_B of the second trench T2 may be greater than the length, in the third direction Z, of the sidewalls T2_S of the second trench T2, but the present inventive concept is not limited thereto.

The first semiconductor chip 200 may be electrically connected to the substrate 100 through bumps 600, which are between the first semiconductor chip 200 and the substrate 100.

The bumps 600 may connect pads 210 of the first semiconductor chip 200 to the substrate 100. For example, the bumps 600 may be connected to some of the wiring 121 of the substrate 100. The bumps 600 may have, for example, a spherical or elliptic-spherical shape, but the present inventive concept is not limited thereto. The bumps 600 may include at least one of, for example, Sn, In, Bi, Sb, Cu, Ag, Zn, Pb, and a combination thereof, but the present inventive concept is not limited thereto.

The pads 210 of the first semiconductor chip 200 may be disposed on the first surface 200_1 of the first semiconductor chip 200. The pads 210 may include, for example, Cu, a Cu alloy, Ni, Pd, Pt, Au, cobalt (Co), or a combination thereof, but the present inventive concept is not limited thereto.

The second semiconductor chip 300 may be disposed on the first semiconductor chip 200. The second semiconductor chip 300 may have first and second surfaces 300_1 and 300_2, which are opposite to each other. The second semiconductor chip 300 may be electrically connected to the substrate 100 through the pads 310, which are formed on the second surface 300_2 of the second semiconductor chip 300.

The pads 310 may include, for example, Cu, a Cu alloy, Ni, Pd, Pt, Au, Co, or a combination thereof, but the present inventive concept is not limited thereto.

Referring to FIGS. 1 and 2, the second semiconductor chip 300 may have first and second lateral sides 301 and 302, which are opposite to each other in the first direction Y, and third and fourth lateral sides 303 and 304, which are opposite to each other in the second direction X and are connected to the first and second lateral sides 301 and 302. The first through fourth lateral sides 301 through 304 may connect the first and second surfaces 300_1 and 300_2, which are opposite to each other, to each other.

Referring to FIG. 1, a length X1, in the second direction X, from, for example, the third lateral side 203 of the first semiconductor chip 200, to, for example, the third lateral side 303 of the second semiconductor chip 300, may be the same as a length X2, in the second direction X, from, for example, the fourth lateral side 204 of the first semiconductor chip 200, to, for example, the fourth lateral side 304 of the second semiconductor chip 300.

In addition, the length X1, in the second direction X, from the third lateral side 203 of the first semiconductor chip 200 to the third lateral side 303 of the second semiconductor chip 300 may differ from the length X2, in the second direction X, from the fourth lateral side 204 of the first semiconductor chip 200 to the fourth lateral side 304 of the second semiconductor chip 300. For example, the location of the second semiconductor chip 300 may vary depending on the size of the second semiconductor chip 300, and the second semiconductor chip 300 is not limited to being on the first semiconductor chip 200.

A length Y1, in the first direction Y, from the first lateral side 201 of the first semiconductor chip 200 to the first lateral side 301 of the second semiconductor chip 300 may differ from the length, in the first direction Y, from the second lateral side 202 of the first semiconductor chip 200 to the second lateral side 302 of the second semiconductor chip 300.

For example, as the lateral side 202 of the first semiconductor chip 200 is in contact with the lateral side 302 of the second semiconductor chip 300, as illustrated in FIG. 1, the length Y1, in the first direction Y, from the first lateral side 201 of the first semiconductor chip 200 to the first lateral side 301 of the second semiconductor chip 300 may be greater than the length, in the first direction Y, from the second lateral side 202 of the first semiconductor chip 200 to the second lateral side 302 of the second semiconductor chip 300.

Referring to FIGS. 1 and 4, the second lateral side 302 of the second semiconductor chip 300 may be aligned with the second lateral side 202 of the first semiconductor chip 200 in the third direction Z.

The sidewalls T1_S of the first trench T1 may be aligned with the third lateral side 303 of the second semiconductor chip 300 in the third direction Z. The sidewalls T2_S of the second trench T2 may be aligned with the first lateral side 301 of the second semiconductor chip 300 in the third direction Z.

The mold layer 400 may cover the first and second semiconductor chips 200 and 300 and may fill the first and second trenches T1 and T2. The mold layer 400 may cover at least part of the first passivation film 111 on the substrate 100.

The mold layer 400 may include an insulating polymer material such as, for example, an epoxy molding compound (EMC). The mold layer 400 may include a thermosetting resin such as an epoxy resin, a thermoplastic resin such as polyimide, or a resin including a reinforcing material such as a filler, for example, ABF, FR-4, or a BT resin.

At least one of, for example, silica ($SiO_2$), alumina ($Al_2O_3$), silicon carbide (SiC), barium sulfate ($BaSO_4$), talc, mud, mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and/or calcium zirconate ($CaZrO_3$) may be used as the filler. The material of the filler is not particularly limited.

An adhesive layer 500 may be attached to the first surface 300_1 of the second semiconductor chip 300. The second semiconductor chip 300 may be mounted on the first semiconductor chip 200 via the adhesive layer 500. The adhesive layer 500 may include at least one of, for example, a liquid epoxy, an adhesive tape, a conductive medium, and a combination thereof, but the present inventive concept is not limited thereto.

An underfill material 700 may be formed on the substrate 100. The underfill material 700 may fill the space between the substrate 100 and the first semiconductor chip 200. The underfill material 700 may fix the first semiconductor chip 200 onto the substrate 100 and may thus prevent breakage of the first semiconductor chip 200. The underfill material 700 may cover the bumps 600. The bumps 600 may electrically connect the substrate 100 and the first semiconductor chip 200 to each other through the underfill material 700.

The underfill material 700 may include an insulating polymer material such as, for example, an EMC, but the present inventive concept is not limited thereto. In an exemplary embodiment of the present inventive concept, the underfill material 700 may include a different material from the mold layer 400. For example, the underfill material 700 may include an insulating material having a higher fluidity than that of the mold layer 400. Accordingly, the underfill material 700 can efficiently fill the narrow space between the substrate 100 and the first semiconductor chip 200.

Figure 5:
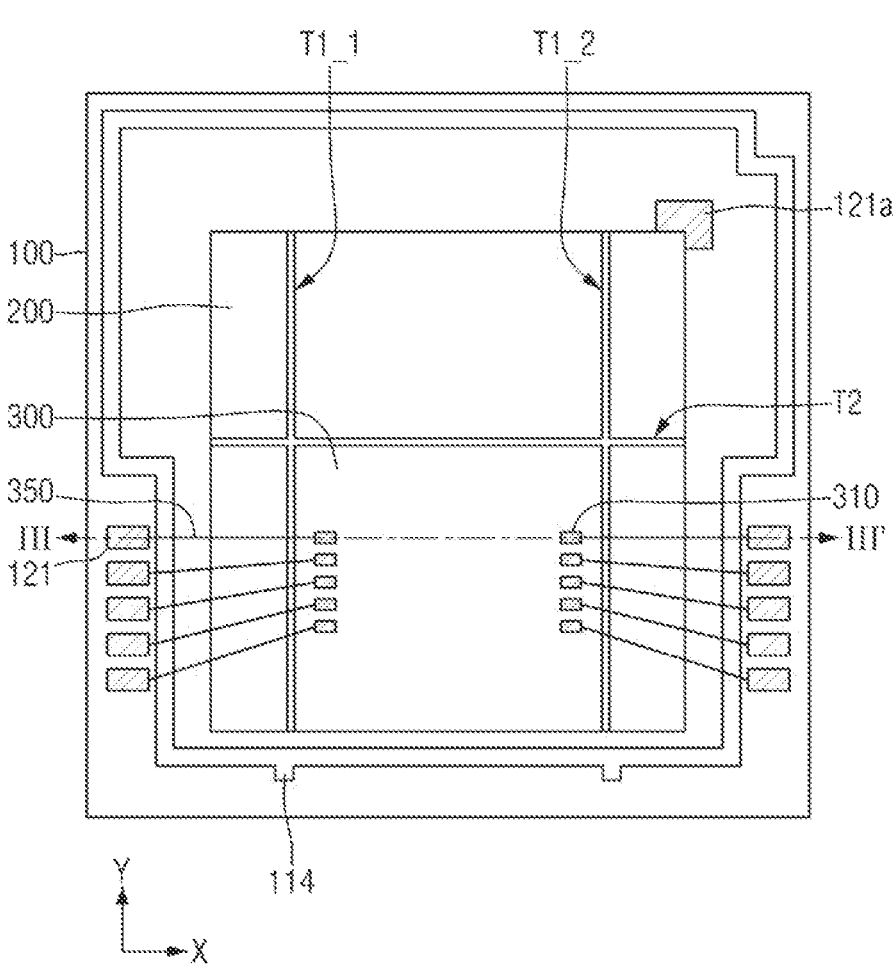
FIG. 5 is a layout view of a semiconductor package according to an exemplary embodiment of the present inventive concept.
Figure 6:
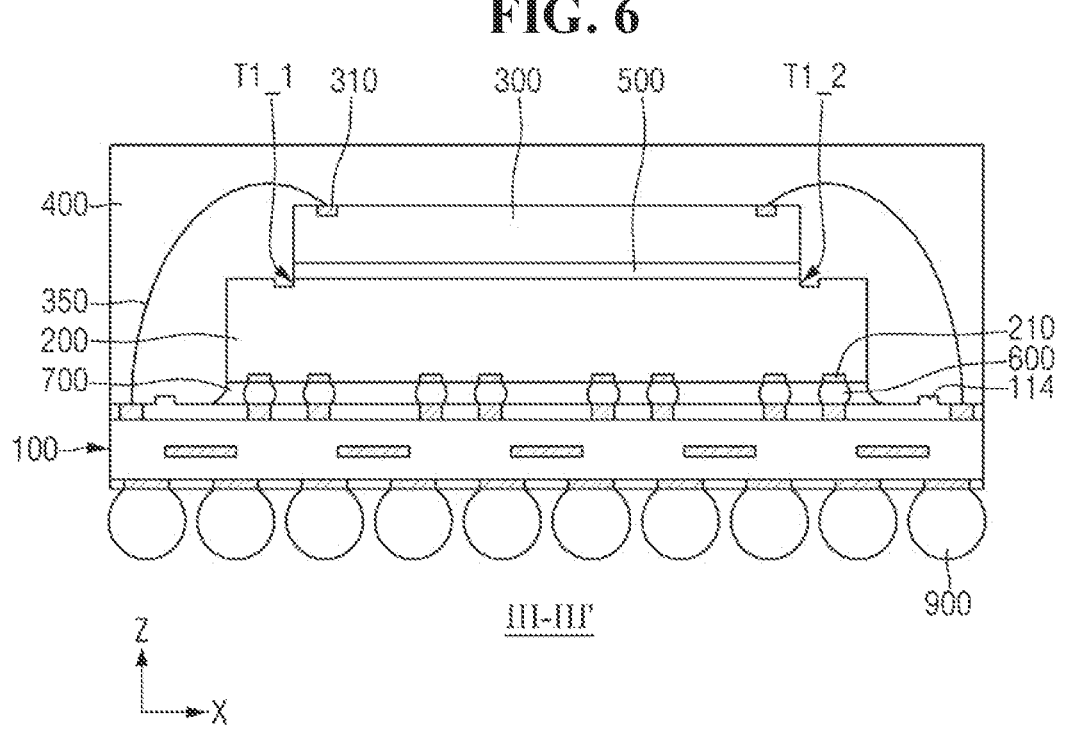
FIG. 6 is a cross-sectional view taken along line III-III' of FIG. 5.

FIG. 5 is a layout view of a semiconductor package according to an exemplary embodiment of the present inventive concept. FIG. 6 is a cross-sectional view taken along line III-III' of FIG. 5. For convenience, the semiconductor package of FIGS. 5 and 6 will hereinafter be described, focusing mainly on the differences with the semiconductor package of FIGS. 1 through 4. Redundant descriptions may be omitted or briefly discussed.

Referring to FIG. 5, a plurality of first trenches T1, which extend in a first direction Y, may be formed on a first semiconductor chip 200. For example, the first trenches T1 may include (1_1)-th and (1_2)-th trenches T1_1 and T1_2, which are spaced apart from each other in a second direction X.

Referring to FIG. 6, the (1_1)-th and (1_2)-th trenches T1_1 and T1_2 may be aligned with both lateral sides of a second semiconductor chip 300, which oppose each other.

The (1_1)-th trench T1_1 may have sidewalls extending in a third direction Z and a bottom surface connecting the sidewalls to each other, and one of the sidewalls of the (1_1)-th trench T1_1 may be aligned with a first sidewall of the second semiconductor chip 300 in the third direction Z.

The (1_2)-th trench T1_2 may have sidewalls extending in a third direction Z and a bottom surface connecting the sidewalls to each other, and one of the sidewalls of the (1_2)-th trench T1_2 may be aligned with a second sidewall of the second semiconductor chip 300 in the third direction Z. For example, the first sidewall of the second semiconductor chip 300 may oppose the second sidewall of the semiconductor chip 300.

Figure 7:
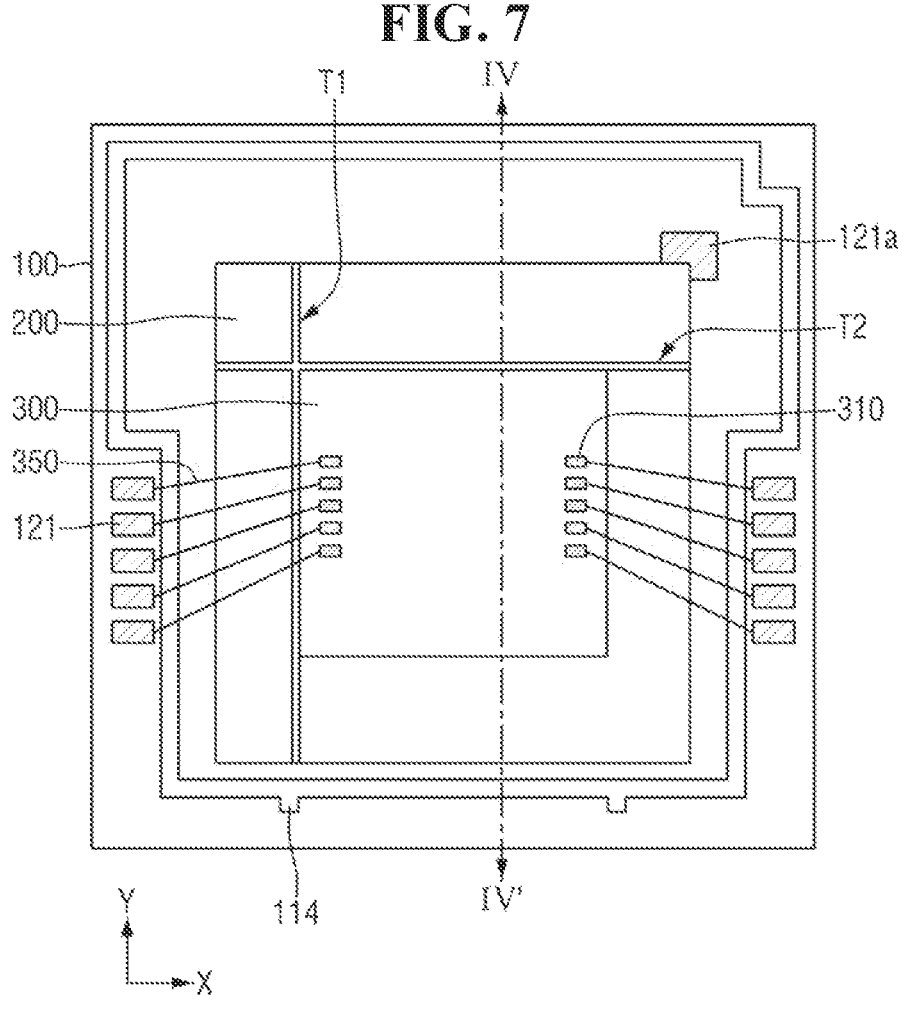
FIG. 7 is a layout view of a semiconductor package according to an exemplary embodiment of the present inventive concept.
Figure 8:
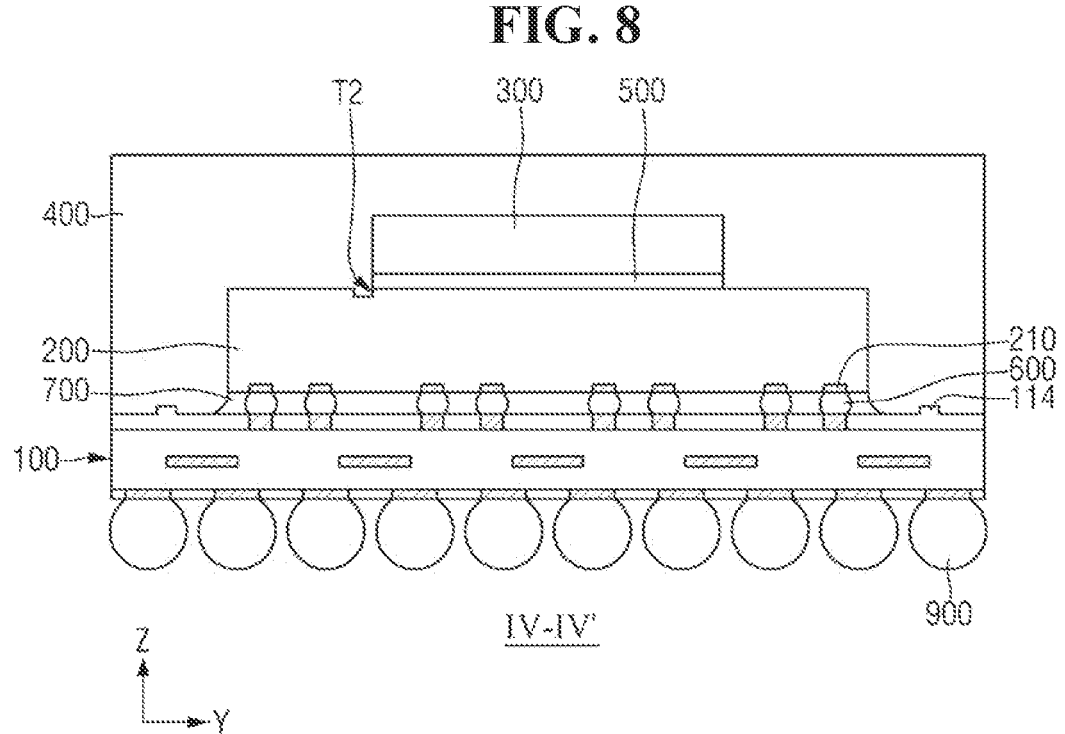
FIG. 8 is a cross-sectional view taken along line IV-IV' of FIG. 7.

FIG. 7 is a layout view of a semiconductor package according to an exemplary embodiment of the present inventive concept. FIG. 8 is a cross-sectional view taken along line IV-IV' of FIG. 7. For convenience, the semiconductor package of FIGS. 7 and 8 will hereinafter be described, focusing mainly on the differences with the semiconductor package of FIGS. 1 through 4. Redundant descriptions may be omitted or briefly discussed.

Referring to FIGS. 7 and 8, a second semiconductor chip 300 may be disposed on the first semiconductor chip 200 in a middle region thereof. In this case, the sides of the second semiconductor chip 300 might not be in contact with the sides of the first semiconductor chip 200.

The length, in a first direction Y, from a first lateral side 201 of the first semiconductor chip 200 to a first lateral side 301 of the second semiconductor chip 300 may be the same as the length, in the first direction Y, from a second lateral side 202 of the first semiconductor chip 200 to a second lateral side 302 of the second semiconductor chip 300.

In addition, the location of the second semiconductor chip 300 on the first semiconductor chip 200 is not particularly limited to what is illustrated in FIGS. 1 through 8. For example, the location of the second semiconductor chip 300 may vary depending on the size of the second semiconductor chip 300. In addition, the locations and the number of first trenches T1 and second trenches T2 may also vary depending on the size and the location of the second semiconductor chip 300.

Even in this case, the second semiconductor chip 300 can be precisely aligned on the first semiconductor chip 200 by the first and second trenches T1 and T2.

Figure 9:
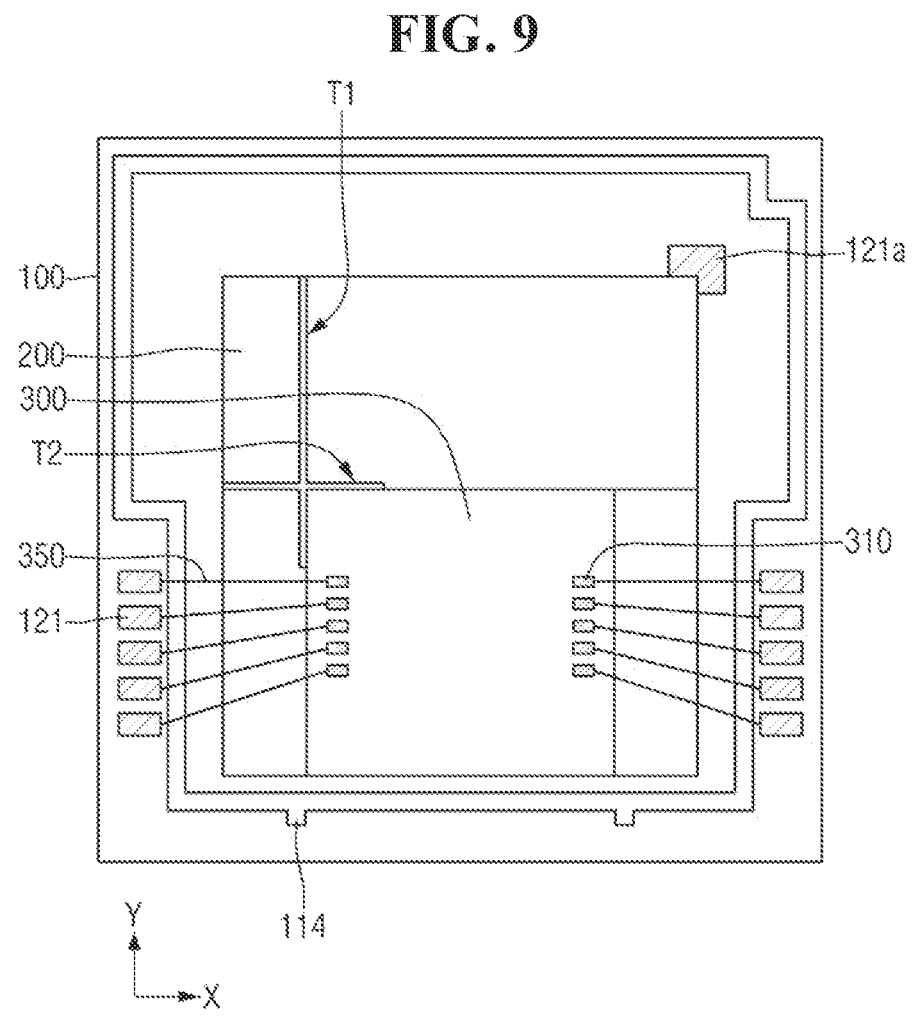
Figure 10:
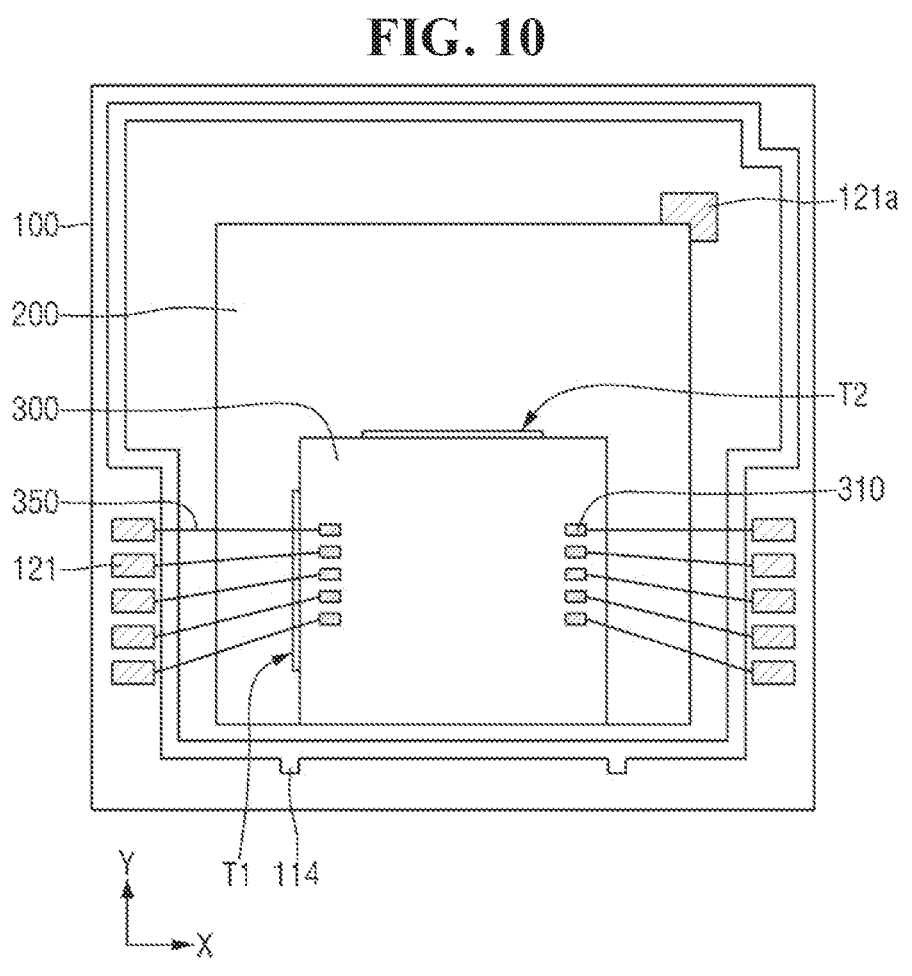

FIGS. 9 and 10 are layout views of semiconductor packages according to an exemplary embodiment of the present inventive concept. For convenience, the semiconductor packages of FIGS. 9 and 10 will hereinafter be described, focusing mainly on the differences with the semiconductor package of FIGS. 1 through 4. Redundant descriptions may be omitted or briefly discussed.

Referring to FIG. 9, first and second trenches T1 and T2 may extend in first and second directions Y and X, respectively, but not entirely through a first semiconductor chip 200. For example, the start points of the first and second trenches T1 and T2 may be in contact with lateral sides of the first semiconductor chip 200, and the end points of the first and second trenches T1 and T2 might not be in contact with the lateral sides of the first semiconductor chip 200.

Referring to FIG. 10, the length by which the first and second trenches T1 and T2 extend in the first and second directions Y and X, respectively, may be less than the lengths, in the first and second directions Y and X, of the second semiconductor chip 300. For example, the start points and the end points of the first and second trenches T1 and T2 might not be in contact with the lateral sides of the first semiconductor chip 200.

FIGS. 11 through 14 illustrate a method of fabricating a semiconductor package according to an exemplary embodiment of the present inventive concept. For convenience, descriptions of features or elements that have already been described above with reference to FIGS. 1 through 4 will be omitted. In addition, for convenience, a second alignment pattern 114 and external connecting terminals 900 are not illustrated in FIGS. 11 through 14.

Figure 11:
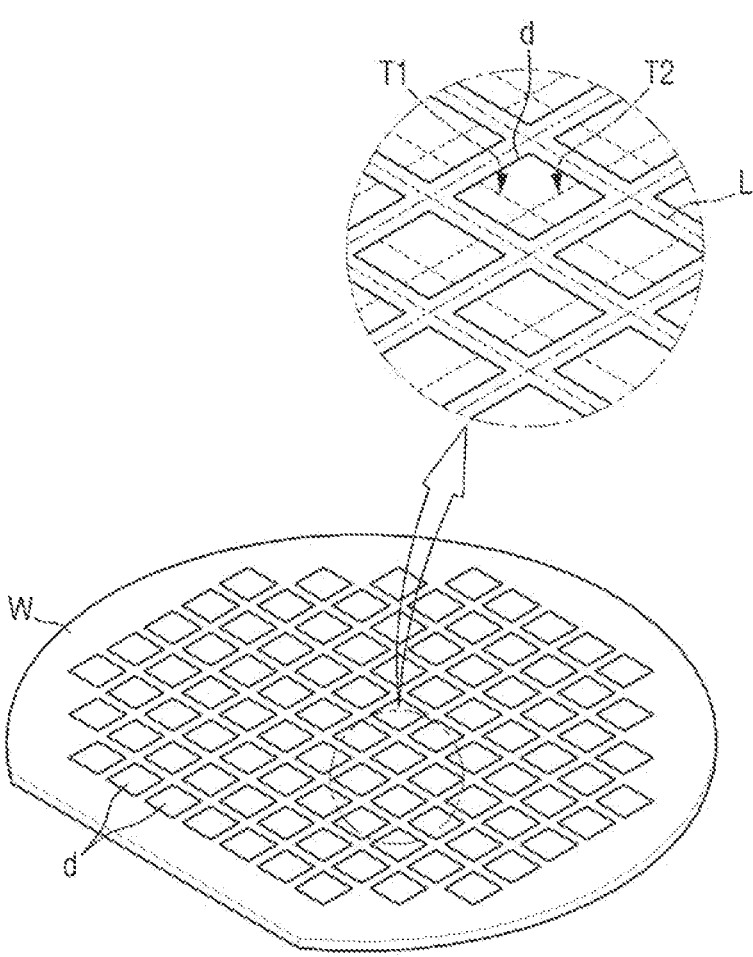

Referring to FIG. 11, a plurality of dies d may be formed on a silicon wafer W, and trenches (T1 and T2) may be formed on the top surface of each of the dies d. In this case, the trenches (T1 and T2) may be formed by applying laser light to the top surface of each of the dies d. The trenches (T1 and T2) may be formed to intersect one another. FIG. 11 illustrates that two trenches (T1 and T2) are formed on each of the dies D, but the number and the locations of trenches (T1 and T2) are not particularly limited.

Figure 12:
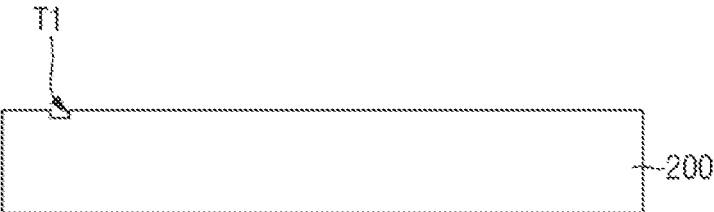

Referring to FIG. 12, a first semiconductor chip 200 with first and second trenches T1 and T2 formed thereon may be obtained by cutting the silicon wafer W along cutting lines L. Multiple first semiconductor chips 200 may be obtained from the silicon wafer W.

Figure 13:
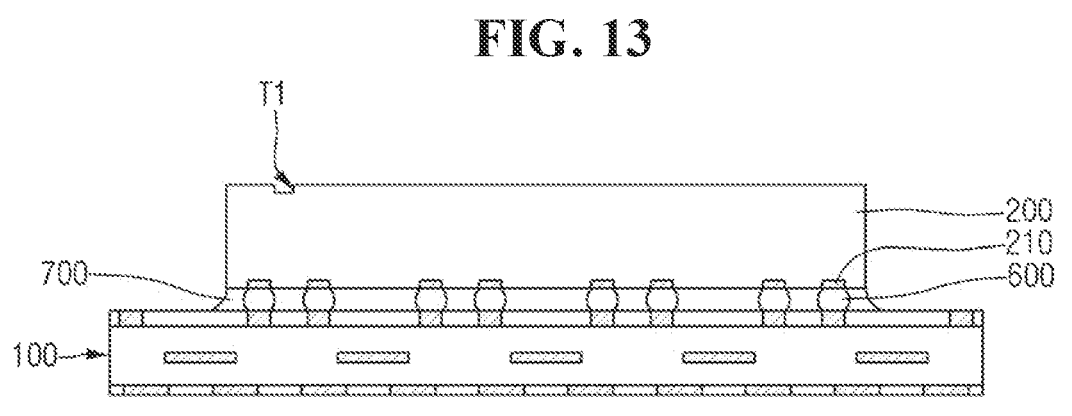

Referring to FIG. 13, a substrate 100 may be attached to the bottom of the first semiconductor chip 200. For example, the substrate 100 may include an insulating layer and a wiring layer that have already been described above with reference to FIG. 2.

The first semiconductor chip 200 may be fixed onto the substrate 100 by forming an underfill material 700, which fills the space between the substrate 100 and the first semiconductor chip 200.

Figure 14:
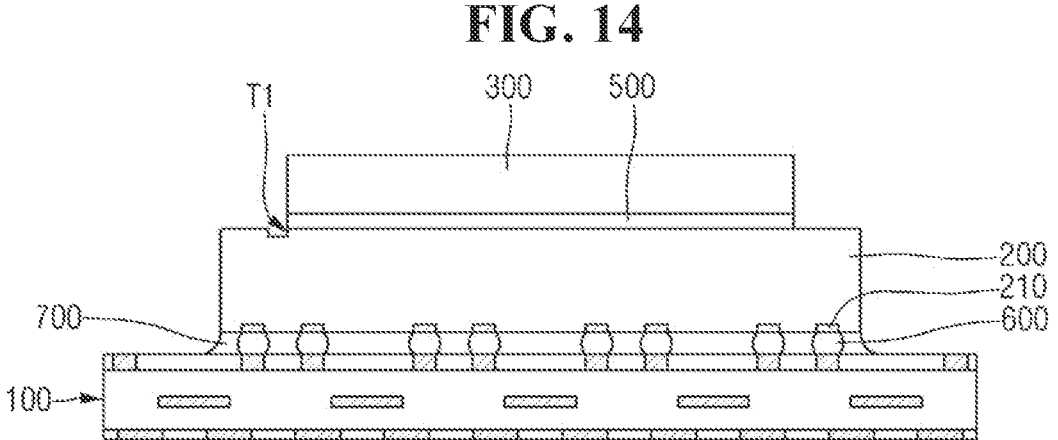

Referring to FIG. 14, a second semiconductor chip 300 may be formed on the first semiconductor chip 200. The second semiconductor chip 300 may be stacked on the first semiconductor chip 200 via an adhesive layer 500, which attaches the second semiconductor chip 300 to the first semiconductor chip 200.

In this case, the second semiconductor chip 300 may be formed in a region between the first and second trenches T1 and T2 on the first semiconductor chip 200. The sidewalls of each of the first and second trenches T1 and T2 may be vertically aligned with the second semiconductor chip 300. For example, the alignment of semiconductor chips can be improved by forming trenches on a silicon wafer and stacking the semiconductor chips along the trenches.

Thereafter, a mold layer 400, which covers the first and second semiconductor chips 200 and 300 and fills the first trench T1, may be formed.

The first semiconductor chip 200 and the substrate 100 may be electrically connected to each other via bumps 600 disposed between the substrate 100 and the first semiconductor chip 200. The second semiconductor chip 300 and the substrate 100 may be electrically connected to each other via bonding wires 350. In this manner, a semiconductor package according to an exemplary embodiment of the present inventive concept can be obtained.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor package comprising:
a substrate;
a first semiconductor chip disposed on the substrate, wherein the first semiconductor chip includes first and second surfaces, which are opposite to each other, and has first and second trenches formed on the first surface thereof, wherein the first and second trenches extend in first and second directions, respectively, wherein the first and second direction intersect each other;

a second semiconductor chip disposed on the first semiconductor chip and in a region between the first and second trenches; and
a mold layer covering the first and second semiconductor chips and filling the first and second trenches.

2. The semiconductor package of claim 1, wherein
each of the first and second trenches includes sidewalls extending in a third direction, which intersects the first and second directions, and a bottom surface connecting to the sidewalls, and
the sidewalls of the first trench are aligned with the second semiconductor chip in the third direction.

3. The semiconductor package of claim 1, wherein
the second semiconductor chip further includes a third surface on the first semiconductor chip and a fourth surface opposite to the third surface,
the second surface of the first semiconductor chip is electrically connected to the substrate via bumps disposed between the first semiconductor chip and the substrate, and
the fourth surface of the second semiconductor chip is electrically connected to the substrate via bonding wires.

4. The semiconductor package of claim 1, wherein
the substrate includes a first alignment pattern, which protrudes from a top surface of the substrate, and
the first alignment pattern is disposed to at least partially surround the first semiconductor chip.

5. The semiconductor package of claim 1, wherein
the first semiconductor chip is a silicon (Si) chip, and
the second semiconductor chip is a memory chip.

6. The semiconductor package of claim 1, wherein
the first semiconductor chip further includes first and second lateral sides, which are opposite to each other in the first direction, and third and fourth lateral sides, which are opposite to each other in the second direction and are connected to the first and second lateral sides,
the second semiconductor chip includes fifth and sixth lateral sides, which are opposite to each other in the first direction, and seventh and eighth lateral sides, which are opposite to each other in the second direction and are connected to the fifth and sixth lateral sides, and
a length, in the second direction, from the third lateral side of the first semiconductor chip to the seventh lateral side of the second semiconductor chip is the same as a length, in the second direction, from the fourth lateral side of the first semiconductor chip to the eighth lateral side of the second semiconductor chip.

7. The semiconductor package of claim 6, wherein the sixth lateral side of the second semiconductor chip is vertically aligned with the second lateral side of the first semiconductor chip.

8. The semiconductor package of claim 6, wherein
sidewalls of the first trench are vertically aligned with the seventh lateral side of the to second semiconductor chip, and
sidewalls of the second trench are vertically aligned with the fifth lateral side of the second semiconductor chip.

9. A semiconductor package comprising:
a substrate;
a first semiconductor chip disposed on the substrate, wherein the first semiconductor chip has first and second trenches formed thereon along first and second directions, which intersect each other; and
a second semiconductor chip disposed on the first semiconductor chip,
wherein each of the first and second trenches includes sidewalls extending in a third direction, which intersects the first and second directions, and a bottom surface connecting to the sidewalls, and the sidewalls of the first trench are aligned with the second semiconductor chip in the third direction.

10. The semiconductor package of claim 9, wherein the second semiconductor chip is disposed in a region between the first and second trenches, and lateral sides of the second semiconductor chip are aligned with lateral sides of the first semiconductor chip in the third direction.

11. The semiconductor package of claim 9, further comprising:

a mold layer covering the first and second semiconductor chips, wherein the mold layer fills the first and second trenches.

12. The semiconductor package of claim 9, wherein the first semiconductor chip includes a first surface, which faces the substrate, and a second surface, which is opposite to the first surface, the second semiconductor chip includes a third surface, which faces the first semiconductor chip, and a fourth surface, which is opposite to the third surface, the first surface of the first semiconductor chip is electrically connected to the substrate via bumps disposed between the first semiconductor chip and the substrate, and the fourth surface of the second semiconductor chip is electrically connected to the substrate via bonding wires.

13. The semiconductor package of claim 9, wherein the substrate includes a first alignment pattern, which protrudes from a top surface of the substrate, and the first alignment pattern includes first and second extensions, which are spaced apart from each other to correspond to the second semiconductor chip.

14. The semiconductor package of claim 9, wherein the substrate includes a second alignment pattern, which is disposed on the substrate and corresponds to a corner of the first semiconductor chip.

* * * * *